United States Patent
Ozard

(10) Patent No.: US 10,600,718 B1
(45) Date of Patent: Mar. 24, 2020

(54) HEAT SINK PACKAGE

(71) Applicant: II-VI OptoElectronic Devices, Inc., Warren, NJ (US)

(72) Inventor: Kenneth Sean Ozard, Middlesex, NJ (US)

(73) Assignee: II-VI Delaware, Inc., Wilmington, DE (US)

( * ) Notice: Subject to any disclaimer, the term of this patent is extended or adjusted under 35 U.S.C. 154(b) by 33 days.

(21) Appl. No.: 14/956,906

(22) Filed: Dec. 2, 2015

Related U.S. Application Data

(60) Provisional application No. 62/087,009, filed on Dec. 3, 2014.

(51) Int. Cl.
| | |
|---|---|
| *H01L 29/778* | (2006.01) |
| *H01L 23/373* | (2006.01) |
| *H01L 29/20* | (2006.01) |
| *H01L 25/16* | (2006.01) |

(52) U.S. Cl.
CPC .......... *H01L 23/3736* (2013.01); *H01L 25/16* (2013.01); *H01L 29/2003* (2013.01); *H01L 29/7787* (2013.01)

(58) Field of Classification Search
CPC ..... H01L 2924/13064; H01L 29/66431; H01L 29/66462; H01L 29/778; H01L 29/7781; H01L 29/7782; H01L 29/7783; H01L 21/4803; H01L 21/4875; H01L 23/367; H01L 23/3735; H01L 23/3736; H01L 2023/4043; H01L 2023/405; H01L 29/2003; H01L 29/7787

See application file for complete search history.

(56) References Cited

U.S. PATENT DOCUMENTS

| | | | | |
|---|---|---|---|---|
| 8,796,843 | B1* | 8/2014 | Babic | H01L 24/17 257/694 |
| 2002/0036345 | A1* | 3/2002 | Iseki | H01L 21/563 257/734 |
| 2002/0130720 | A1* | 9/2002 | Pavio | H03F 3/607 330/286 |
| 2004/0130037 | A1* | 7/2004 | Mishra | H01L 21/8252 257/778 |
| 2004/0245543 | A1* | 12/2004 | Yoo | H01L 33/0079 257/103 |
| 2010/0038680 | A1* | 2/2010 | Nakayama | H01L 29/42316 257/190 |
| 2012/0061727 | A1* | 3/2012 | Lee | H01L 29/2003 257/183 |

(Continued)

*Primary Examiner* — Thomas L Dickey
(74) *Attorney, Agent, or Firm* — Wendy W. Koba

(57) ABSTRACT

This invention minimizes the thermal resistance and maximizes the power density of a power transistor by mounting the transistor in flip-chip fashion on a heat sink/heat spreader and conducting the heat from the active semiconductor layer through the heat sink/heat spreader (as opposed to through the low conductivity substrate). Illustratively, the semiconductor device package comprises: a high electron mobility transistor (HEMT) formed in a layer of Gallium Nitride (GaN) having a first major surface; at least one metal contact pad making thermal contact with the layer of GaN on its first major surface; a heat sink/heat spreader in electrical and thermal contact with the contact pad(s) on the first surface; and a substrate on which the heat sink is mounted.

13 Claims, 11 Drawing Sheets

(56) References Cited

U.S. PATENT DOCUMENTS

| | | | |
|---|---|---|---|
| 2013/0075932 A1* | 3/2013 | Schwarzer | H01L 23/5226 257/774 |
| 2015/0294921 A1* | 10/2015 | Viswanathan | H01L 23/367 257/76 |
| 2016/0064302 A1* | 3/2016 | Yamada | H01L 23/3735 257/685 |
| 2016/0071781 A1* | 3/2016 | Sheridan | H01L 23/345 257/705 |
| 2016/0086881 A1* | 3/2016 | Standing | H01L 23/3107 257/76 |

* cited by examiner

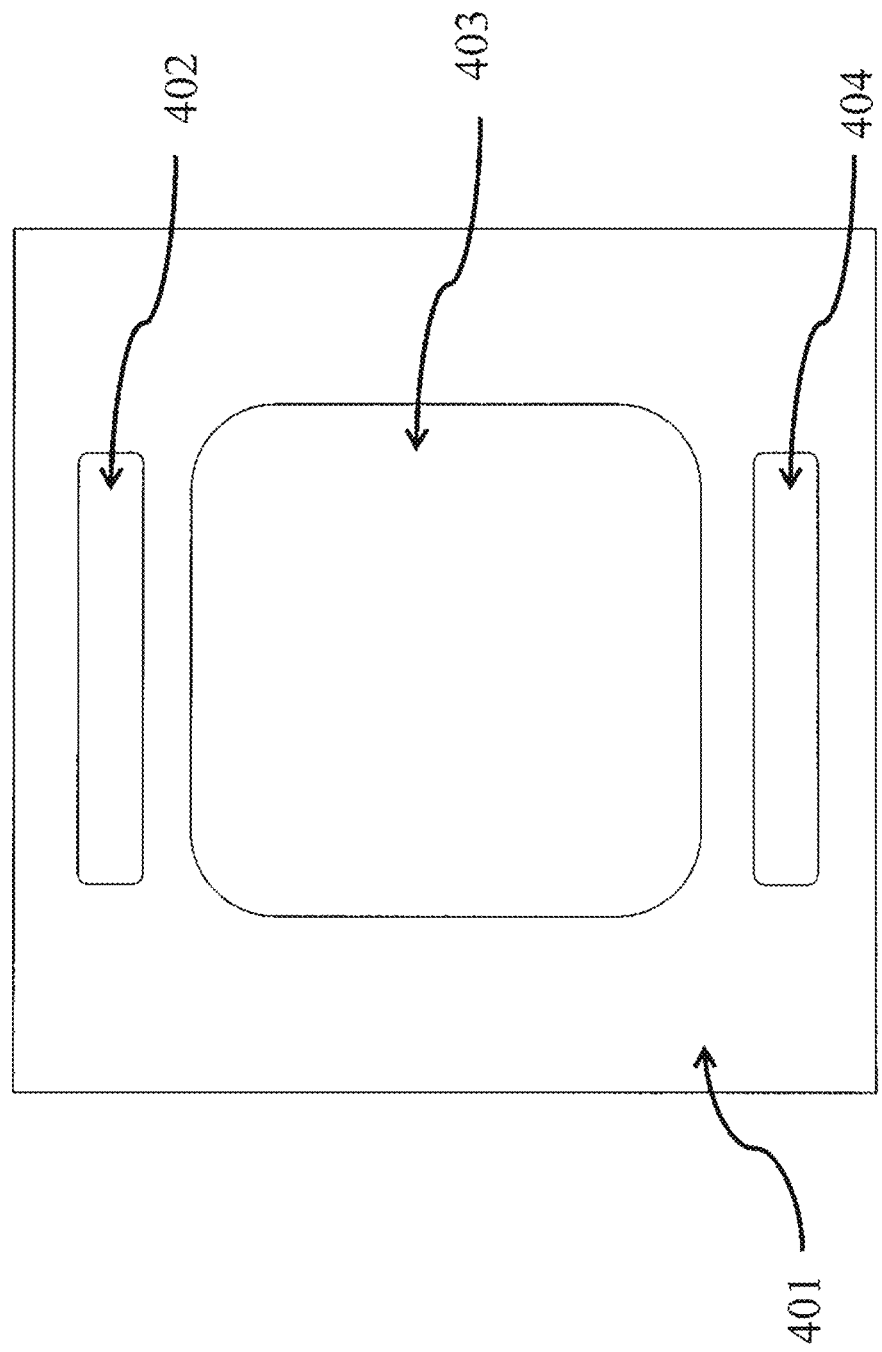

HEAT SINK PACKAGE

CROSS REFERENCE TO RELATED APPLICATION

This application claims benefit of provisional application Ser. No. 62/087,009, filed Dec. 3, 2014, which application is incorporated by reference herein in its entirety.

BACKGROUND

High power and wide bandwidth RF power transistors and power amplifiers are important in wireless communication systems. Optimal design and performance of high power wideband power amplifiers require suitable transistor technologies such as high power density and low capacitance transistors. Gallium Nitride (GaN) on Silicon Carbide (SiC) power transistors are an example of suitable transistors offering very high power densities, high voltages, high impedances and excellent bandwidth. However, the higher power densities of such power transistors make heat removal more difficult relative to lower power density technologies where a greater cross sectional area is typically available for conduction. In addition, reduced cost, size and weight are very important for the advancement of modern wireless communication systems. As a result the high cost of high performance, high power density transistors (such as GaN on SiC) is undesirable; and considerable pressure exists to reduce the cost of such technology or substitute technologies.

Gallium Nitride (GaN) on Silicon is promising as an alternative due to a much more attractive cost structure. However Silicon has poor thermal conductivity relative to Silicon Carbide which results in higher thermal resistance, lower achievable power density and thus degraded performance and reduced bandwidth. In addition, the traditional packaging techniques for high power RF transistors involve heat conduction through a thinned substrate from the front or active side of the substrate where the transistors are formed to the opposite or back side of the substrate. The thinned substrate often contains through wafer vias for the required very low inductance grounding in common source and common emitter amplifier applications. The conduction of heat through the substrate results in an undesirable thermal resistance; and the use of a poor conductivity substrate such as Silicon makes this problem worse.

SUMMARY

This invention minimizes the thermal resistance and maximizes the power density of the power transistor (for example, RF GaN HEMT on Silicon) by conducting the heat through a highly conductive heat contact (or pad) on the front of the active semiconductor layer (as opposed to through the low conductivity substrate) and then through a solid metal heat sink/heat spreader and then through a thin RF PCB or laminate that forms the substrate of a chip scale package. The heat sink/heat spreader serves the dual purpose of absorbing heat and spreading heat to improve thermal uniformity.

In some embodiments, a thin metal interlayer connects the heat contact on the front of the semiconductor to the heat sink/heat spreader. In some embodiments, the heat sink/heat spreader is attached to the next layer of interconnect using solder while other embodiments use sintered silver to further enhance the performance of the heat sink/heat spreader with an added layer of high thermal conductivity silver.

Optionally, a second metal heat sink/heat spreader may be located in the next layer of interconnect such as a PCB or laminate. For example the second metal heat sink/heat spreader could be solid plated copper or a solid copper slug inserted inside a microwave laminate package.

In an illustrative embodiment, the semiconductor device package comprises: at least one high electron mobility transistor (HEMT) formed in a layer of Gallium Nitride (GaN) having a first major surface; at least one metal contact pad making thermal contact with the layer of GaN on its first major surface; a heat sink/heat spreader in thermal contact with the contact pad(s) on the first surface; and a substrate on which the heat sink/heat spreader is mounted.

BRIEF DESCRIPTION OF DRAWING

These and other objects, features and advantages of the invention will be more readily apparent from the following detailed description in which:

FIG. 4 is a bottom view of an illustrative embodiment of a substrate used in the practice of the invention;

DETAILED DESCRIPTION

Figure 1:
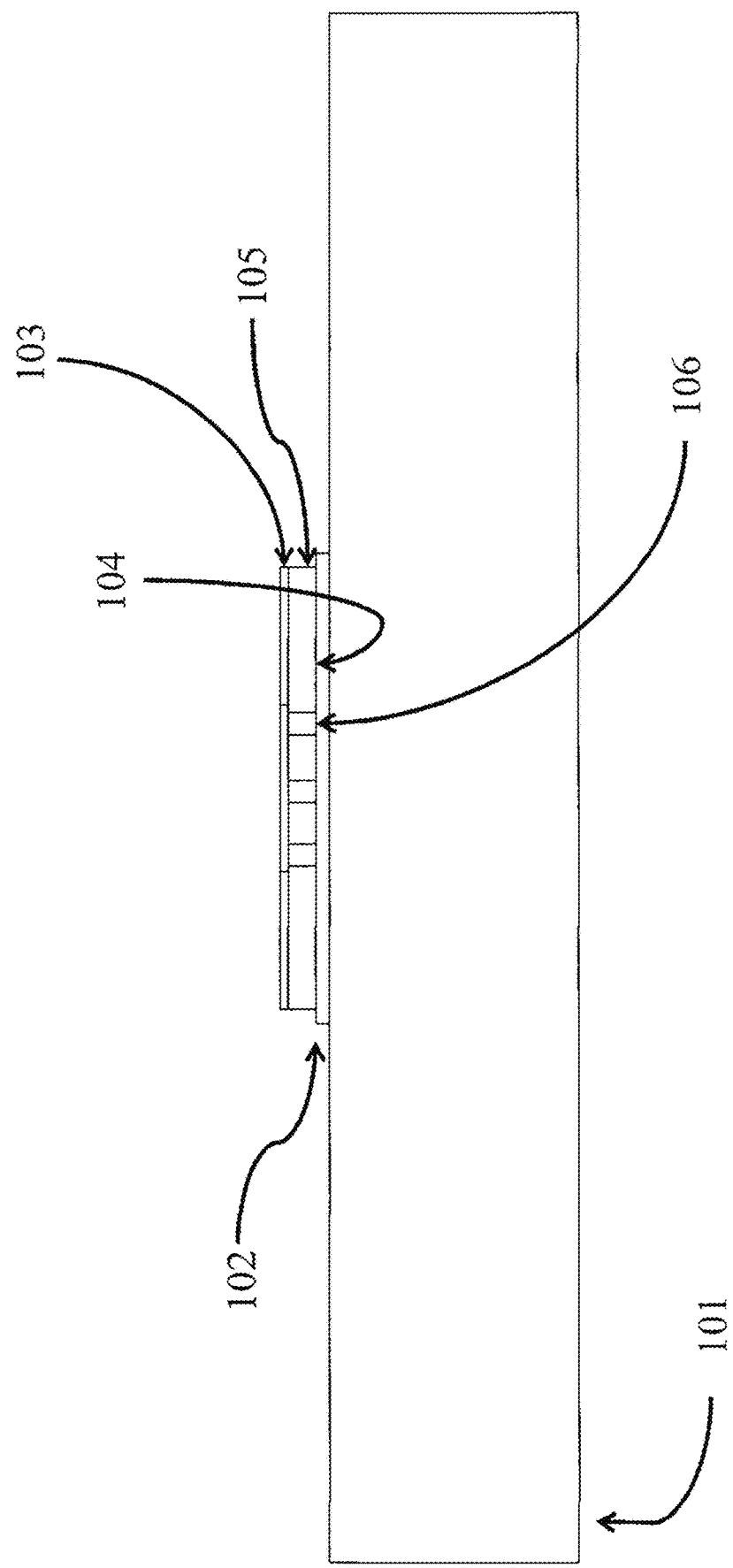
FIG. 1 is a cross-section of a first conventional prior art semiconductor package.

FIG. 1 is a cross-section of a conventional flanged semiconductor package 100 in which a semiconductor integrated circuit is mounted active-side-up on a flange or base. Package 100 comprises a semiconductor integrated circuit including a semiconductor substrate 105 having upper and lower major surfaces 103, 104 and a flange or base 101. Package 100 may also include a lid (not shown). Active semiconductor devices such as one or more transistors are formed in upper surface (also known as the active side or front side) 103 of the semiconductor substrate. In operation, these devices constitute a concentrated heat source. Package 100 further comprises a thin die attach compound 102 that mechanically and thermally connects the semiconductor substrate to the flange or base. The main thermal resistance in this package is from the semiconductor substrate, the die attach compound and the flange. Through substrate vias 106 typically extend through the semiconductor substrate to connect circuitry on the upper surface that is connected to the active devices to the base 101 through solder or other die attach technologies such as conductive epoxy. Typically, wire bonds (not shown) connect other circuitry on the upper surface to the leads (not shown).

Figure 2:
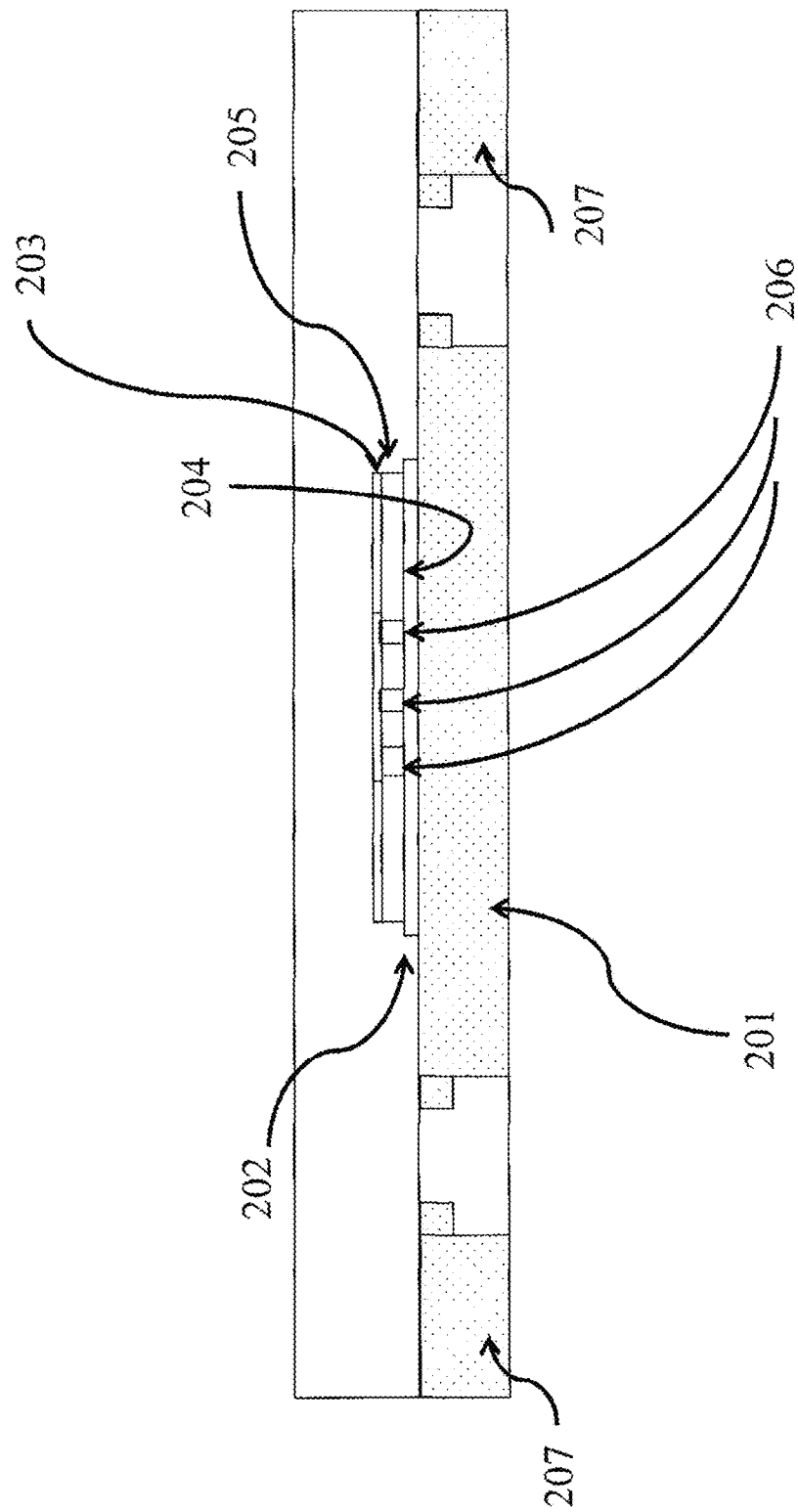
FIG. 2 is a cross-section of a second conventional prior art semiconductor package.

Other prior art structures such as QFN and DFN packages are similar. For example. As shown in FIG. 2, a DFN package illustratively comprises a semiconductor integrated circuit including a semiconductor substrate 205 having upper and lower major surfaces 203, 204 and a die pad 201. Active semiconductor devices such as one or more transistors are formed in active upper surface 203 of the semiconductor substrate. Again, these devices constitute a concentrated heat source when operating. Package 200 further comprises a thin die attach compound 202 that mechanically and thermally connects the semiconductor substrate to the flange or base. Again, the main thermal resistance in this package is from the semiconductor substrate, the die attach compound and the die pad. Through substrate vias 206 typically extend through the semiconductor substrate to connect circuitry on the upper surface that is connected to the active devices to the die pad 201. Typically, wire bonds (not shown) connect other circuitry on the upper surface to the pins 207.

Figure 3A:
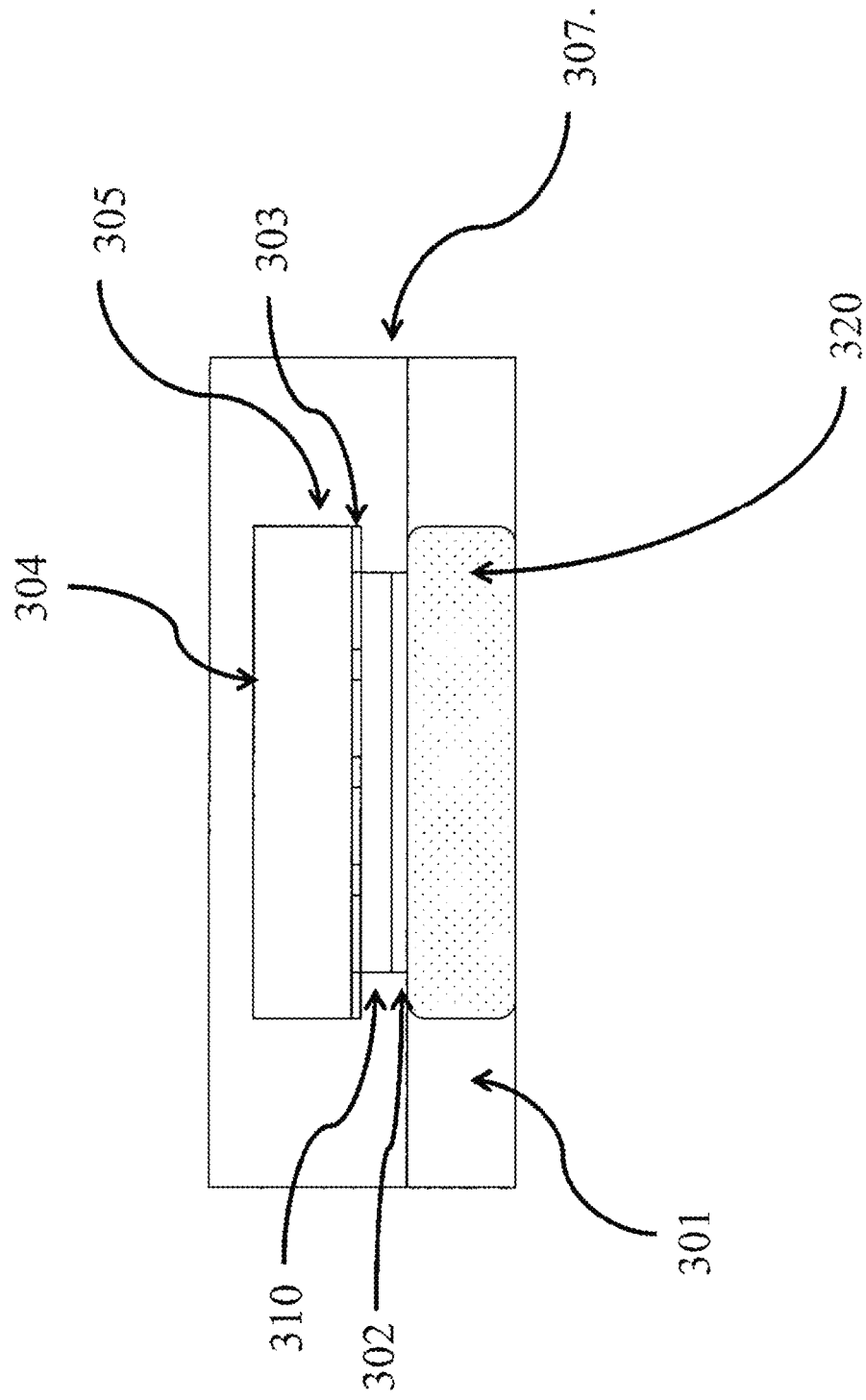
FIG. 3a is a cross-section of an illustrative embodiment of the present invention.

FIG. 3a depicts a cross-section of an illustrative embodiment 300 of the invention. Embodiment 300 comprises an integrated circuit mounted in a flip-chip fashion (i.e., active side down) on a heat sink/heat spreader in a substrate. More particularly, embodiment 300 comprises a layer 305 of III-V semiconductor material having first and second major surfaces 303, 304 with one or more active semiconductor devices such as transistors formed in first major surface 303 of the layer of semiconductor material; a first heat sink/heat spreader 310 making mechanical, electrical and thermal contact with the layer of semiconductor material on its first major surface 303; a second heat sink/heat spreader 320 in mechanical, electrical and thermal contact with the first heat sink/heat spreader 310; and a substrate 301 on which second heat sink/heat spreader 320 is embedded. A thin die attach compound 302 mechanically, electrically and thermally connects the first heat sink/heat spreader 310 to the second heat sink/heat spreader 320 and thereby connects the semiconductor devices in surface 303 to substrate 301. An interconnect 330 (FIG. 3c) connects surface 303 to heat sink/heat spreader 310. Additional electrical connections between the semiconductor integrated circuit and the substrate are also made as shown in FIG. 4. A mold compound or metal lid 307 typically surrounds the integrated circuit and seals it from the environment.

Heat sink/heat spreaders 310, 320 perform the dual functions of absorbing heat and spreading it to improve thermal uniformity. Illustratively both heat sink/heat spreaders are made of metal, preferably copper. Heat sink/heat spreader 310 illustratively is made of a plated metal such as copper. Heat sink/heat spreader 320 illustratively is also made of a plated metal such as copper or is a solid slug of a metal such as copper.

In a preferred embodiment of the invention, the III-V semiconductor material is Gallium Nitride (GaN) on silicon; and the transistors are radio frequency (RF) high electron mobility transistors (HEMT). While Silicon has poor thermal conductivity as noted above, GaN on Silicon devices are significantly less expensive than GaN on Silicon Carbide devices; and any thermal conductivity issues are avoided by mounting the GaN on Silicon device in flip-chip fashion on substrate 301. In addition, epitaxial buffer layers such as AlN used when GaN is grown on a lattice mismatched substrate such as Silicon have relatively poor thermal conductivity and degrade the thermal resistance. The use of a copper heatsink 310 and ohmic thermal contacts on the active layer 303 effectively bypasses the higher thermal resistivity buffer layer between active layer 303 and semiconductor substrate 305.

Illustratively, a common source GaN HEMT is formed in the layer of semiconductor material. In this embodiment, heat sink/heat spreader 310 is connected to large area ohmic source contacts on the substrate of the GaN HEMT. Depending on the process/technique used, different thicknesses and sizes of the contacts will be possible and different stresses will result. Due to the varying materials, thicknesses, stresses, etc, certain cases will require accommodation (such as segmenting) to achieve reliability (for example, to pass thermal cycling requirements without cracking).

Die attach 302 in this example is solder. However other highly conductive materials such as screen printed sintered silver could be used with the appropriate layout/design. Substrate 301 illustratively is formed from a thin RF laminate such as MGC (Mitsubishi Gas Company) HL522NT.

Figure 3B:
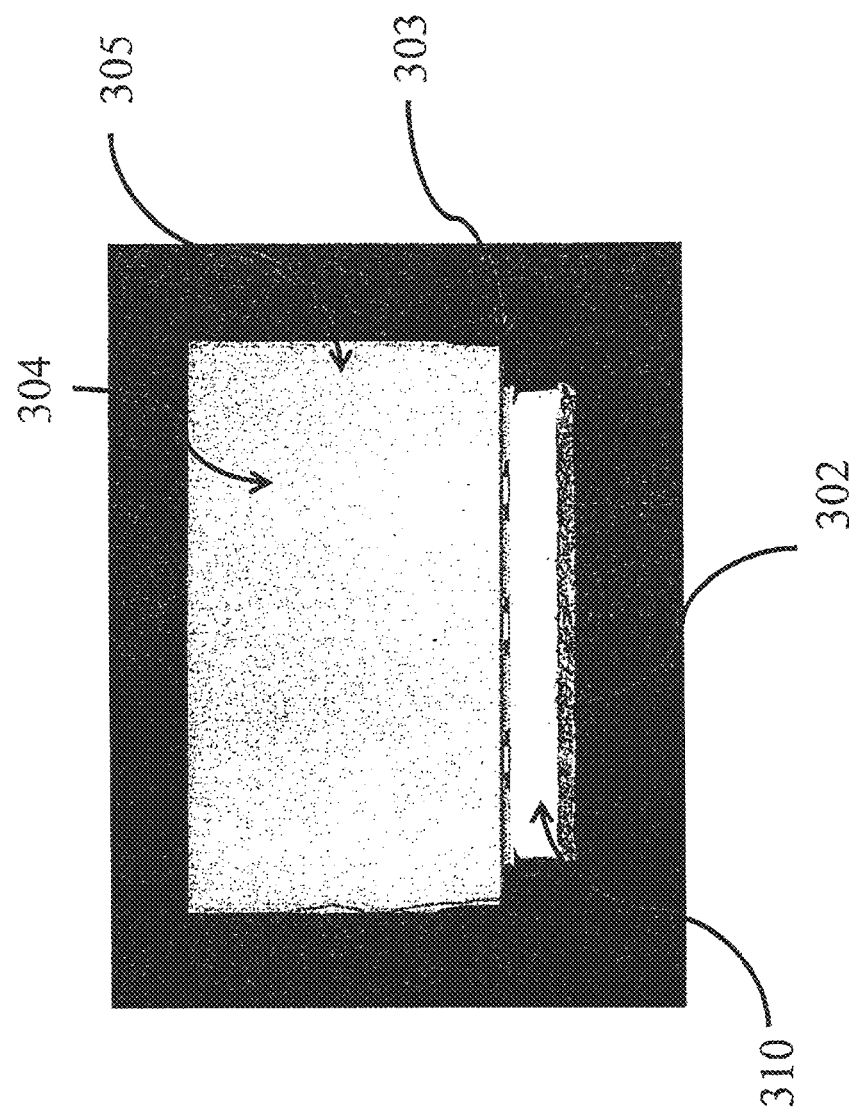
FIG. 3b is a cross-section of an illustrative embodiment of the present invention.
Figure 3C:
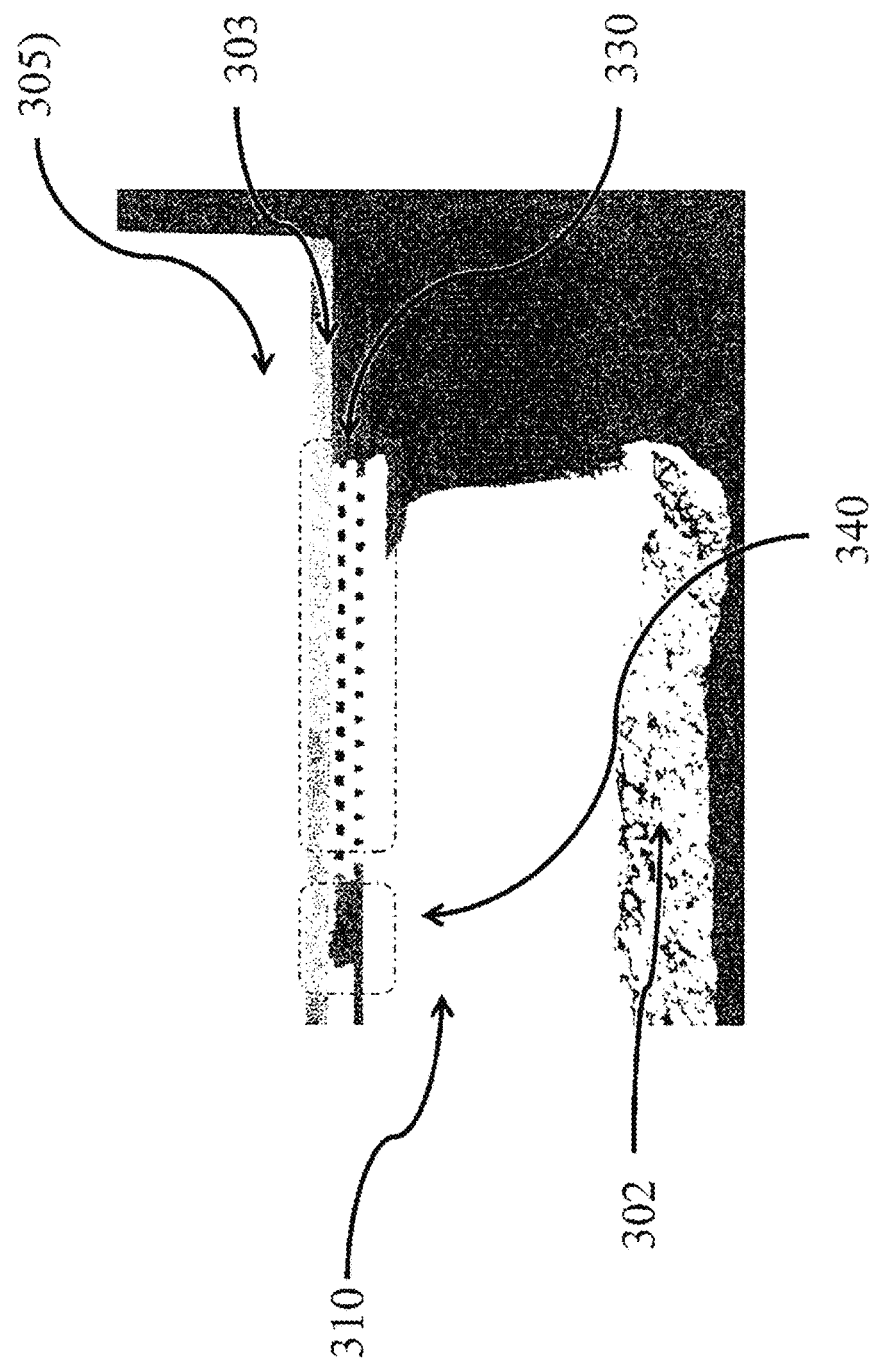
FIG. 3c is a cross-section of an illustrative embodiment of the present invention.

FIGS. 3b and 3c are micrographs of a cross-section of a fabricated sample that illustrate several key features that improve the performance of the device and differentiate the invention from prior art technologies. In FIG. 3B, heat sink/heat spreader 310 is continuous and covers the majority of the area of the die in contrast to the much smaller integrated areal density of the small bumps and/or bars in conventional flip chip technology. The much higher integrated areal density of the heat sink/heat spreader 310 improves the thermal resistance and thermal uniformity of the invention.

In a preferred embodiment of the invention, heat sink/heat spreader 310 is constructed from a thick layer of highly conductive copper which is then attached to the next level of interconnect using a thick layer of very highly conductive silver (such as sintered silver) to further improve significantly the thermal uniformity and resistance of the invention in significant contrast to flip chip techniques. The thick copper and/or silver performs an important heat spreading function which improves thermal uniformity and also enables better thermal use of an array of copper vias on secondary interconnect layers in an assembled product. Without the heat spreading function, the optimal or efficient utilization of thermal vias in secondary interconnect layers can be limited to only those placed very close to the heat sources. Heat sink/heat spreader 320 is similar; and the same remarks apply.

FIG. 3c illustrates another important distinction between the invention and flip chip technology. Preferably, the connection between the heat sink/heat spreader 310 and the semiconductor surface 303 is made through a high density metal interconnect 330 that produces a low thermal resistance metal-semiconductor contact. Metal interconnect 330 includes an ohmic contact layer in contact with semiconductor surface 303 and one or more (two are shown) layers of interlayer dielectric gold layers. In a particular preferred embodiment, the metal-semiconductor contact is fabricated using an ohmic contact metallization process which is in direct contact with the semiconductor.

The use of metal interconnect 330 differentiates the invention from flip chip technology in several ways: the low thermal resistance of the high density metal sandwich formed by semiconductor surface 303, interconnect 330 and heat sink/heat spreader 310; the high areal density (percentage of the die surface covered) of the interconnect 330; and the termination of the contact directly on a metal-semiconductor interface. These improvements over flip chip technology reduce the thermal resistance and provide higher power densities, lower temperatures and better thermal uniformity. In some application and embodiments these improvements also improve the RF grounding of the device or IC by providing a very low inductance and resistance metal sheet directly on top of the ground connections. The RF grounding improvement can be very significant at high frequencies compared with bond wires or through substrates vias, for example.

Illustratively, interconnect 330 is formed by electroplating layers from a patterned seed layer. The seed layer can be formed by sputtering. Other metals such as aluminum and copper may be used in place of gold, A variety of dielectric materials may be used such as polyimide, BCB (benzocyclobutene), silicon nitride, and silicon oxynitride.

The checkered gold and dielectric cross section of interconnect 330 shown in FIG. 3c can be further improved in preferred embodiments though process changes which reduce or eliminate the dielectric between the square gold vias and increases the metal density closer to 100%. Ideally the layout is also optimized to bring the areal density of heat sink/heat spreaders 310 and 320 as close to 100% as possible.

FIG. 4 is a bottom view of substrate 301 of FIG. 3. As shown in FIG. 4, wide RF IN and RF OUT contacts 402, 404 are located on opposite sides of metal heat sink/heat spreader 310 and have an advantageous width and characteristic impedance similar to that offered by the wide leads of a typical flange package. The wide "flanges" are intended to be optimally designed/sized for the corresponding input and output impedances.

Figure 5A:
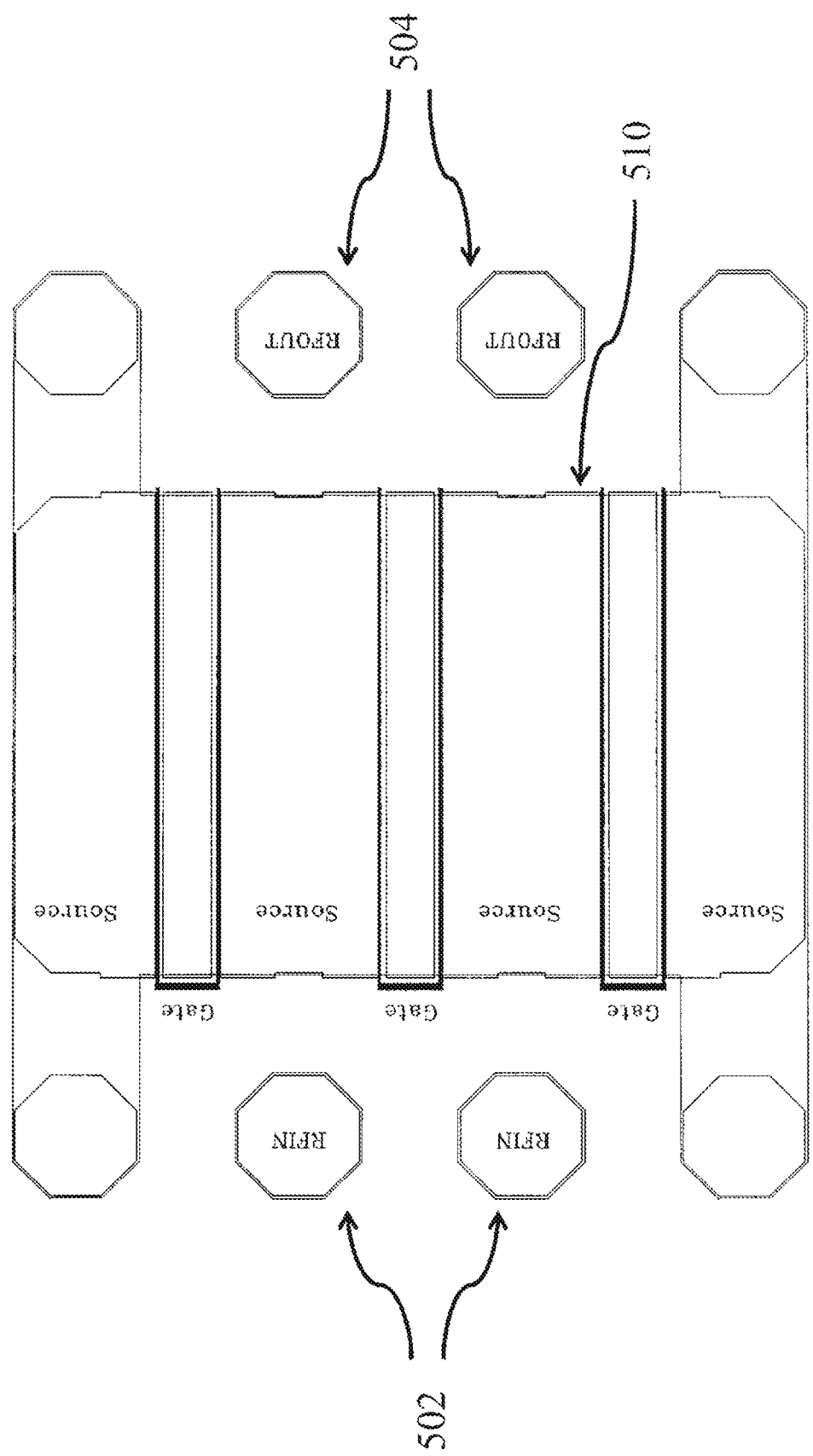
FIG. 5a is a top views of an additional illustrative embodiment of other substrates that may be used in the practice of the invention.

FIG. 5a is a layout of an illustrative embodiment of the invention depicting RFIN contacts 502, RFOUT contacts 504, and their relation to the heat sink/heat spreader 510. FIG. 5a also depicts the connections between the heat sink/heat spreader and the source regions of the power transistor formed in the semiconductor.

Figure 5B:
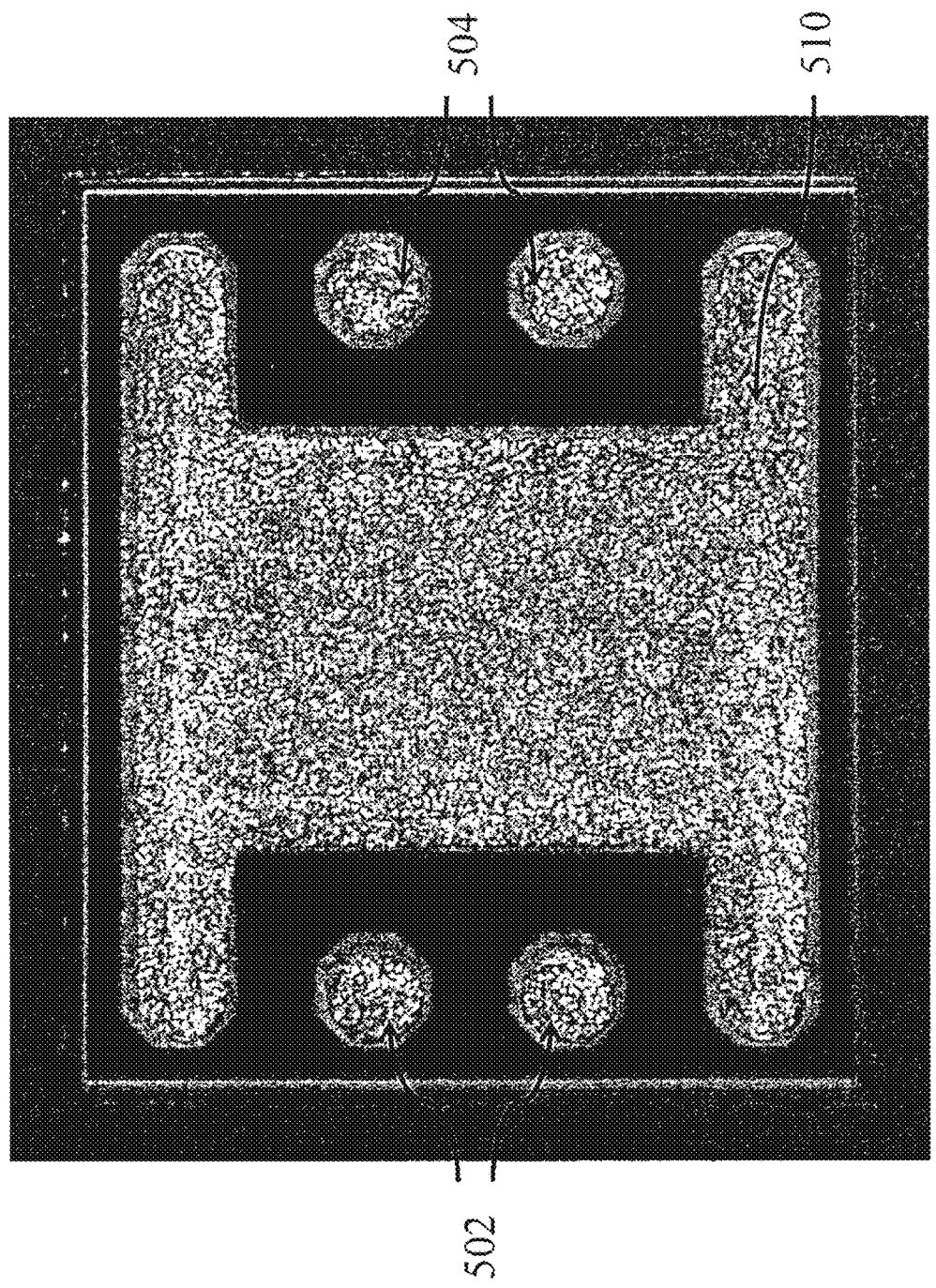
FIG. 5b is a bottom views of an additional illustrative embodiment of other substrates that may be used in the practice of the invention.

The much higher integrated areal density of the thick metal heat sink/heat spreader is also evident in FIG. 5b where the micrograph of the solder covered heat sink/heat spreader 510 is shown to cover a very high percentage of the area of the die in contrast to the much lower covered area in flip chip technology.

Figure 5C:
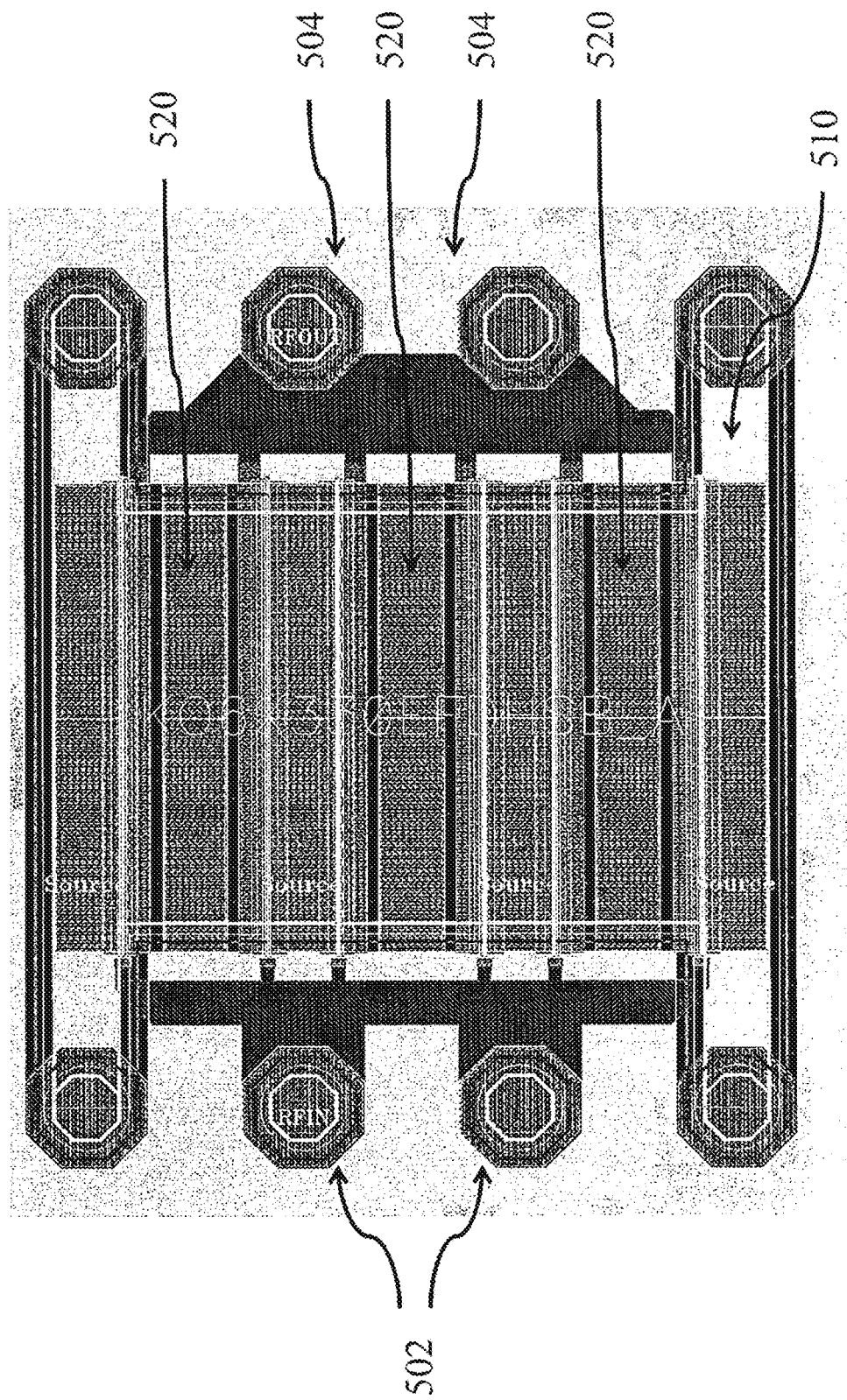
FIG. 5c is a top views of an additional illustrative embodiment of other substrates that may be used in the practice of the invention.

FIG. 5c illustrates a preferred embodiment of the invention where the thermal resistance has been further improved through the added thermal contacts 520 between the semiconductor surface and the metal heat sink/heat spreader 510. The additional contacts serve to separate the heat sources (active transistor sites) while maximizing the area of the die surface covered by the thermal contacts 520 and the metal heat sink/heat spreader 510. Ideally the layout is optimized to bring the areal density of heat sink/heat spreaders 510 and 520 as close to 100% as possible. The thermal resistance of the preferred embodiment shown in 5c is significantly lower than the embodiment illustrated in FIG. 5a with no increase in die size or cost. The additional thermal contact provided by heat sink/heat spreader 520 helps separate the heat sources and "pull" or conduct heat out of the die from the semiconductor into the heat sink/heat spreader 510 resulting in both lower and more uniform temperatures.

Figure 6:
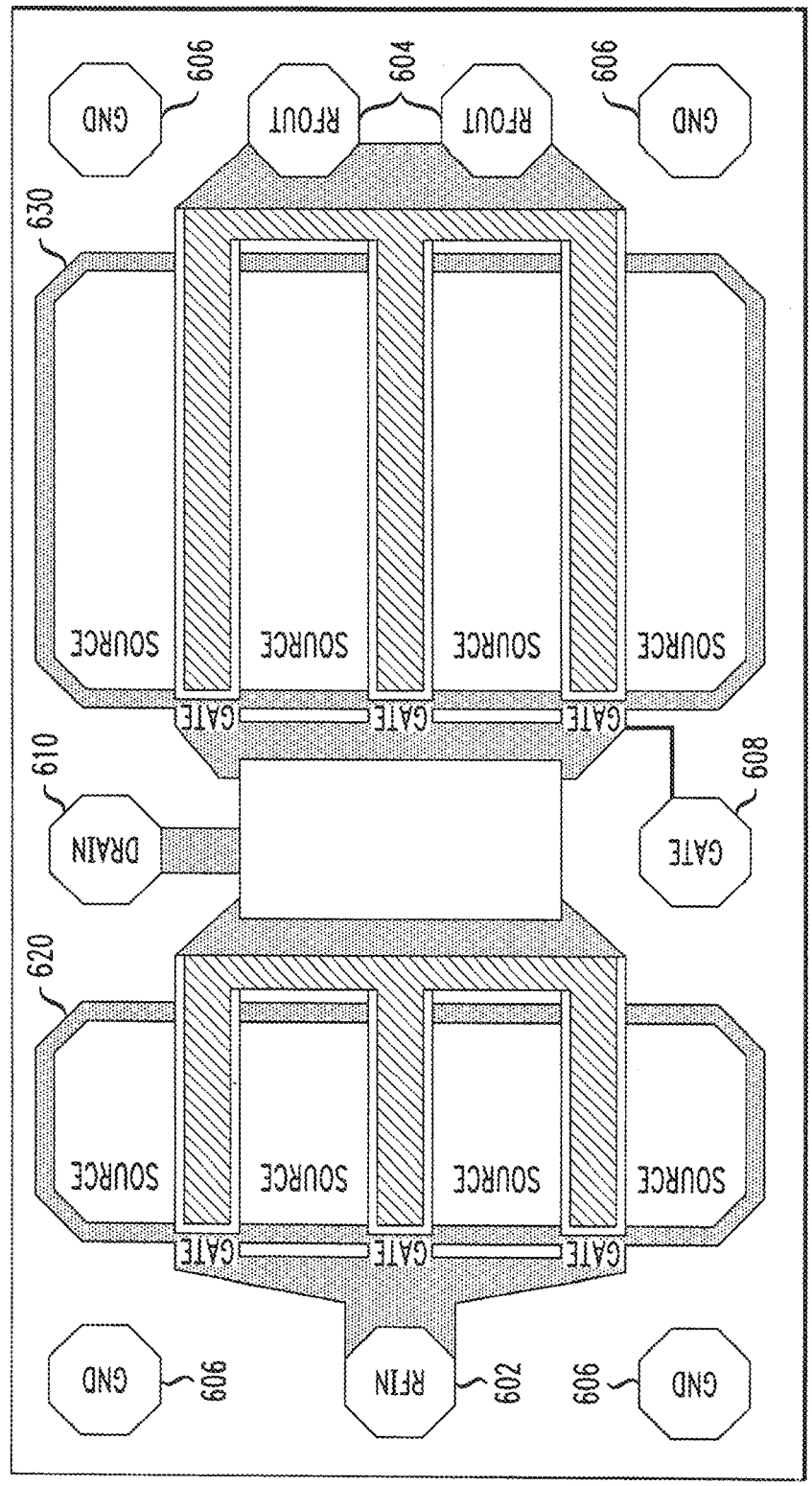
FIG. 6 is a top views of an additional illustrative embodiment of other substrates that may be used in the practice of the invention.

FIG. 6 is a layout of an illustrative embodiment of the invention depicting a two stage power amplifier having RFIN contact 602, RFOUT contacts 604, ground contacts 606, a gate contact 608, a drain contact 610 and their relation to first and second heat sink/heat spreaders 620, 630. FIG. 6 also depicts the connections between the heat sink/heat spreader and the source regions of the power transistor formed in the semiconductor.

Figure 7:
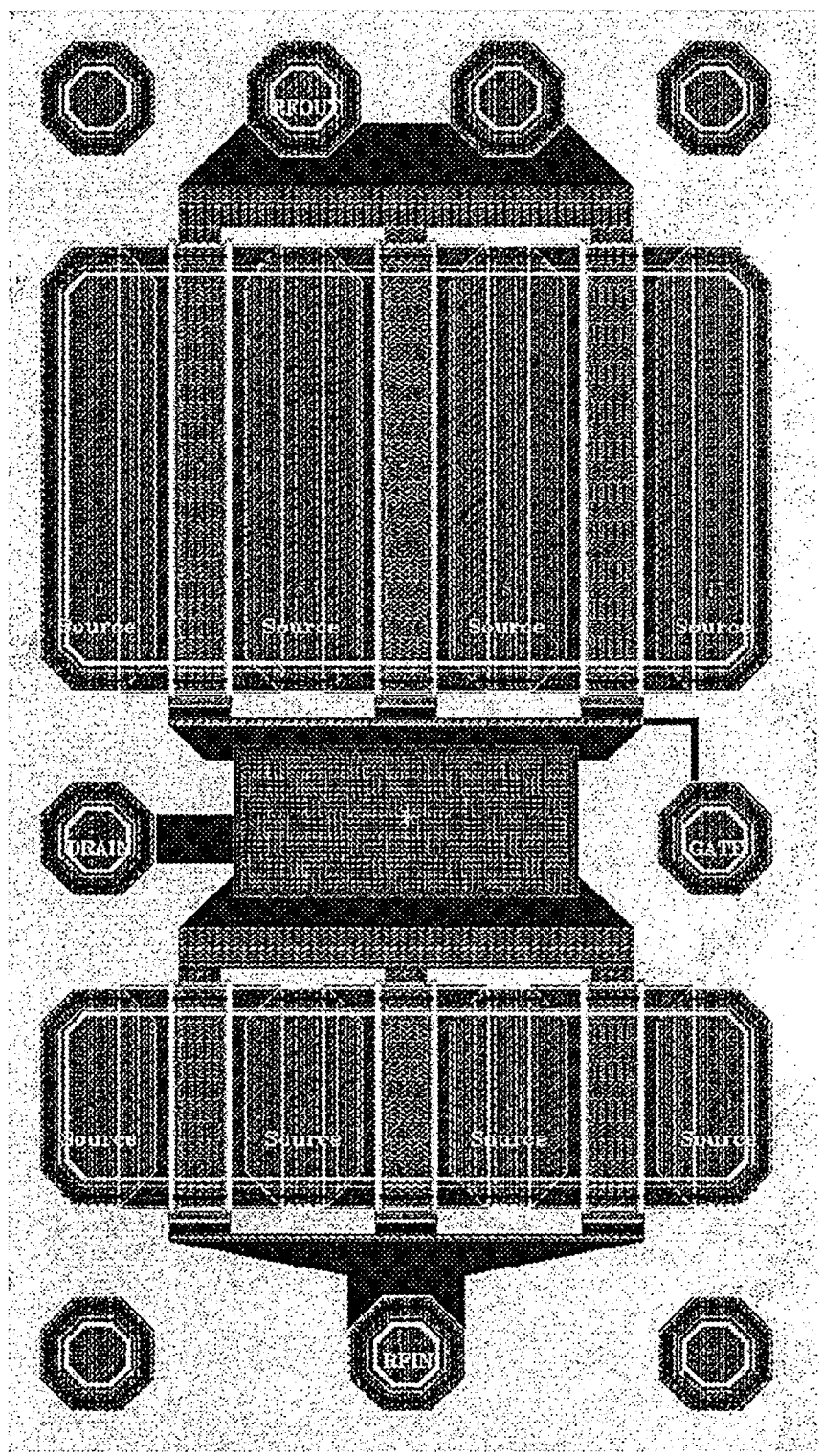
FIG. 7 is a top views of an additional illustrative embodiment of other substrates that may be used in the practice of the invention.

FIG. 7 is a simulation of the appearance of the final device that might be realized from the layout of FIG. 6.

Advantageously, the GaN HEMT or other device is fabricated as one of numerous identical devices on a wafer of the appropriate semiconductor material. Interconnect 330 and heat sink/heat spreader 310 are then formed simultaneously on these identical devices. The devices are then singulated from the wafer, and individual devices are surface mounted in flip-chip fashion on a PCB or laminate, illustratively on a heat sink/heat spreader embedded in the PCB or laminate.

As will be apparent to those skilled in the art, numerous variations may be practiced within the spirit and scope of the present invention. The GaN HEMT may be configured in a manner other than common source; and in such case, heat sink/heat spreader 310 is no longer electrically connected to the ohmic source contacts. For example, the heat sink/heat spreader could still be formed as described above for making ohmic contact with the source (or drain) but would now be located on an electrically isolated regions (such as mesa isolated regions) of the active semiconductor layer on the front surface of the die near the heat sources. In addition, the metal heat sink/heat spreader might not be formed on top of the ohmic contacts but instead be formed on a different region of the die.

Additional passive and/or active components and packages may be integrated onto and/or into the carrier substrate to perform additional functions such as matching, biasing, bypassing and other functions. Such additional passive and/or active components may include surface mount device (SMD) capacitors, CMOS logic die, Lange couplers, quarter wave transmission line transformers and/or impedance inverters. The GaN HEMT may also be configured in cascode with a common emitter hetero-junction bipolar transistor (HBT).

In addition to GaN material systems, a variety of other material systems are available for use in practicing the invention including systems using InGaP, InP, AlGaAs, and GaAs. Details of such systems and others may be found M. Golio (ed.), RF and Microwave Semiconductor Device Handbook (CRC Press, 2002), which is incorporated by reference herein and W. Liu, Fundamentals of III-V Devices, HBTs, MESFETs, and HFETs/HEMTs (Wiley-Interscience, 1999), which is incorporated by reference herein.

What is claimed is:
1. A semiconductor device package comprising:
  a silicon substrate for supporting an integrated circuit mounted in a flip-chip fashion;
  a high electron mobility transistor (HEMT) formed in a layer of Gallium Nitride (GaN) having a first major active device surface mounted in the flip-chip fashion on the silicon substrate;
  an interconnect making thermal contact with the layer of GaN on its first major active device surface, said interconnect comprising a high areal density ohmic contact layer covering a high percentage of the first major active device surface;
  a first high areal density heat sink/heat spreader disposed across a majority of the interconnect, and in electrical and thermal contact with said interconnect; and
  a second high areal density heat sink/heat spreader embedded within the silicon substrate and in electrical and thermal contact with the first heat sink/heat spreader.

2. The device package of claim 1 where the first heat sink/heat spreader is made of copper.

3. The device package of claim 1 wherein the silicon substrate is a laminate.

4. The device package of claim 1 wherein the silicon substrate provides for surface mounting.

5. A semiconductor device package comprising:
a silicon substrate for supporting a transistor mounted in a flip-chip fashion;
a transistor formed in a layer of III-V semiconductor material having a first major active device surface mounted in the flip-chip fashion on the silicon substrate;
an interconnect making thermal contact with the layer of III-V semiconductor material on its first major active device surface, said interconnect comprising a high areal density ohmic contact layer covering a high percentage of the first major active device surface;
a first high areal density heat sink/heat spreader disposed across a majority of the interconnect and in electrical and thermal contact with said interconnect; and
a second high areal density heat sink/heat spreader embedded within the silicon substrate and in electrical and thermal contact with the first heat sink/heat spread.

6. The device package of claim 5 wherein the first heat sink/heat spreader is made of copper.

7. The device package of claim 5, wherein the silicon substrate is a laminate.

8. The device package of claim 5 wherein the silicon substrate provides for surface mounting.

9. A chip scale GaN common source GaN high electron mobility transistor (HEMT) amplifier with one or more integrated high areal density conductive heat spreaders formed across a majority of an active semiconductor surface of a semiconductor die to provide thermal uniformity across the semiconductor die, wherein the one or more integrated high areal density conductive heat spreaders is thermally attached using sintered silver to a solid metal heat sink/heat spreader that is embedded inside a carrier substrate.

10. The device of claim 9 wherein the one or more integrated high areal density conductive heat spreaders are formed in batch processes.

11. The device of claim 9 wherein additional passive and/or active components and packages are integrated onto and/or into the carrier substrate to perform an additional function selected from the group consisting of matching, biasing, and bypassing.

12. The device of claim 11 wherein the additional passive and/or active components include SMD capacitors, CMOS logic die, Lange couplers, quarter wave transmission line transformers and/or impedance inverters.

13. The device of claim 9 wherein the GaN HEMT is configured in cascade with a common emitter HBT (Hetero-Junction Bipolar Transistor).

* * * * *